(12) United States Patent
Blasco Claret et al.

(10) Patent No.: US 7,002,333 B2
(45) Date of Patent: Feb. 21, 2006

(54) PROCESS AND DEVICE FOR COMPENSATING THE LOW FREQUENCY MAGNETIC FIELD IN AN INDUCTIVE SIGNAL COUPLING UNIT

(75) Inventors: Jorge Vicente Blasco Claret, Valencia (ES); Antonio Poveda Lerma, Foios (ES)

(73) Assignee: DiSeno De Sistemas En Silico, S.A., Paterna (ES)

( * ) Notice: Subject to any disclaimer, the term of this patent is extended or adjusted under 35 U.S.C. 154(b) by 0 days.

(21) Appl. No.: 11/010,535

(22) Filed: Dec. 13, 2004

(65) Prior Publication Data

US 2005/0122092 A1    Jun. 9, 2005

Related U.S. Application Data

(63) Continuation of application No. PCT/ES03/00283, filed on Jun. 11, 2003.

(30) Foreign Application Priority Data

Jun. 12, 2002   (ES) ............................. 200201357

(51) Int. Cl.
*H01F 27/42*   (2006.01)
*H01F 17/04*   (2006.01)
(52) U.S. Cl. ...................... 323/356; 336/221
(58) Field of Classification Search ........ 323/355, 323/356, 357, 358, 362, 363, 247–251; 336/15, 336/30, 75, 77, 142, 155, 184, 221
See application file for complete search history.

(56) References Cited

U.S. PATENT DOCUMENTS

| 2,998,564 | A |   | 8/1961 | Lawrence |
|---|---|---|---|---|
| 4,234,824 | A | * | 11/1980 | den Hollander ............ 315/371 |
| 4,255,705 | A | * | 3/1981 | Milkovic .................... 324/127 |
| 4,346,340 | A |   | 8/1982 | Hackett-Jones |
| 4,571,569 | A | * | 2/1986 | Scharl ......................... 336/65 |
| 4,862,014 | A |   | 8/1989 | Myers et al. |
| 6,657,529 | B1 | * | 12/2003 | Albach ....................... 336/182 |

FOREIGN PATENT DOCUMENTS

| EP | 0 521 250 A2 | 1/1993 |
|---|---|---|
| EP | 0 661 864 A1 | 7/1995 |
| WO | WO 98/20468 | 5/1998 |

* cited by examiner

*Primary Examiner*—Matthew V. Nguyen
(74) *Attorney, Agent, or Firm*—Klauber & Jackson

(57) ABSTRACT

Process and device for compensating the low frequency magnetic field in an inductive signal coupling unit. According to the invention the coupling unit comprises a ferromagnetic core (30) which encloses a conductor through which a low frequency current (1) is circulating in order to inject thereon a high frequency signal. Current (1), circulating through the conductor or the magnetic field (3) produced in the coupling unit, is detected, and a compensating current is obtained based on the value obtained in the detection carried out, and the compensating current obtained in the coupling unit is injected through a low pass filter (9) to produce a magnetic field (4) equal and opposite to the produced by current (1) of the conductor in the coupling unit, and thereby avoiding the saturation of the magnetic core (30) without adding insertion loss. In general the invention is applied to communication systems which require the injection of a radio frequency signal on a conductor, and in particular in systems which use the electricity grid as the transmission medium.

7 Claims, 6 Drawing Sheets

PROCESS AND DEVICE FOR COMPENSATING THE LOW FREQUENCY MAGNETIC FIELD IN AN INDUCTIVE SIGNAL COUPLING UNIT

CROSS REFERENCE TO RELATED APPLICATIONS

The present application is a Continuation of co-pending PCT Application No. PCT/ES03/00283 filed Jun. 11, 2003, which in turn, claims priority from Spanish Patent Application Ser. No. P200201357 filed Jun. 12, 2003. Applicants claim the benefits of 35 U.S.C. §120 as to the PCT application and priority under 35 U.S.C. §119 as to the said Spanish application, and the entire disclosures of both applications are incorporated herein by reference in their entireties.

OBJECT OF THE INVENTION

The present invention, as stated in the heading to this descriptive specification, relates to a process and a device that allow to compensate the low frequency magnetic field which is produced in an inductive coupling unit.

The invention is preferably applicable for injecting high frequency signals on the electricity grid by means of an inductive coupling unit, and its object is to minimize the insertion loss of a high frequency signal on the electricity grid, to which end it avoids the effect of magnetic saturation which occurs in the inductive coupling unit.

BACKGROUND OF THE INVENTION

In telecommunications systems, once the signal has been produced in the transmitter it is necessary to inject it into the transmission medium, in order that it reaches the receiver.

The way of carrying out the injection depends mainly on the transmission medium employed.

In the case of injecting signals onto the electricity grid, this can be carried out with inductive coupling units which are usually constituted by current transformers which are placed around the power conductors in which it is desired to induce the signal. In these cases the operation is based on the principle that currents which vary in time generate magnetic fields which vary in time and viceversa. In other words, the radiofrequency (RF) current it is desired to inject, produces a variable magnetic field (in time, and therefore a magnetic flux also variable in time) inside the ferromagnetic core of the coupling unit and, besides, the variation of magnetic flux around a conductor, induces therein a current proportional to this variation.

Based on this principle, it is possible to induce signals between conductors enclosed by the same magnetic core. Because there are high electric currents circulating through the power conductors, and therefore, the magnetic field strength around the cables is very high, the problem arises that if a ferromagnetic core is placed around the cables, the magnetic core can become saturated and unusable for carrying out the function of signal injection.

In the state of the art it is known that this effect can be overcome by including an air gap in the magnetic circuit so that the reluctance of the magnetic circuit is considerably increased and the magnetic flux is decreased dramatically. This implies an increase in the insertion loss of the signal, which is not desirable in communication applications, wherein the loss signifies an effective reduction in the range of the communications system.

To counteract this effect the usual practice is to lengthen the coupling unit in order to try to cover more flux, but this makes the coupling unit more bulky and more expensive, which is not desirable; and all this while seeking a compromise solution between size, air gap, and insertion loss.

A noteworthy precedent of the present invention, is constituted by the document U.S. Pat. No. 4,346,340, which discloses a method for improving the AC behaviour of an inductor such as a transformer or choke; the tendency of the inductor core to be saturated by a low frequency AC or DC current flowing in the winding of the inductor is reduced by detecting the magnitude of such currents and applying a compensating current to a control coil wound on the inductor core, the purpose being to produce a magnetic flux in the inductor core which opposes the component of flux which is tending to cause saturation. An inductor to which this method can be applied comprises a main coil, a magnetic core, a control coil means to detect the presence in this main coil of current at a frequency below a determined limit, and means to apply a control circuit to said control coil, which tends to compensate the flux produced by the detected current.

The present invention allows the inductive coupling to be carried out without saturation of the ferromagnetic core taking place and without additional insertion loss occurring.

SUMMARY OF THE INVENTION

To avoid the drawbacks indicated in the foregoing paragraphs, the invention as claimed, comprises a process for compensating the low frequency magnetic field in an inductive signal coupling unit, wherein the coupling unit comprises a magnetic core which surrounds a conductor through which a low frequency current is circulating in order to inject a high frequency signal therein.

The process of the invention is characterised in that it foresees a selective detection of the current which is circulating through the conductor or of the magnetic field produced in the coupling unit, in order to obtain thereafter a compensating current based on the value obtained in the detection performed, said injection current being produced with an external source, by the actual equipment which wishes to transmit the high frequency signal over the grid or automatically by induction on a winding around the coupler. Subsequently the injection of the compensating current obtained in the coupling unit is produced through a low pass filter which offers a high impedance to the high frequency signal it is desired to inject.

The action of injecting the compensating current results in that, in the inductive coupling unit, a magnetic field is produced equal and opposite to that produced by the current which is circulating through the conductor, whereby saturation is avoided in the magnetic core of the inductive coupling unit without adding insertion loss for the desired signal it is to transmit, and maximum efficiency is obtained.

The invention has been specially conceived to send high frequency signals over the electricity grid in which a low frequency current is circulating.

In one embodiment of the invention the detection of the magnetic field is carried out in the ferromagnetic core of the inductive signal coupling unit. The magnetic field detected is compared with a reference signal in order to obtain the compensating current, so that the signal of the measure of the magnetic field is maintained practically equal to the reference signal, wherein said reference signal lies between 0 and a value such that the coupling unit is prevented from becoming saturated, that is, the signal inside the ferromagnetic core of the coupling unit never surpasses the maximum flux density it is capable of withstanding.

In another embodiment of the invention, the detection is achieved by measuring the current which is circulating in the electricity grid.

The injection of the compensating current obtained, is carried out by means of a compensation winding which is applied on the ferromagnetic core of the inductive signal coupling unit through a low pass filter which offers a high impedance for the high frequency signals it is desired to inject.

In an embodiment of the invention the measurement of the current which is circulating through the conductor is carried out by means of a winding arranged on a ferromagnetic core which is independent of the inductive signal coupling unit.

The invention also foresees that the detection, the obtaining of the compensating current, and the injection of said current are carried out simultaneously by locating a winding with a single winding around a double core which forms the ferromagnetic core of the coupling unit.

The invention also refers to a low frequency magnetic field compensating device in an inductive signal coupling unit which works according to the aforementioned process.

To this end the device of the invention comprises a detector which is selectively constituted by a current detector which is circulating through the conductor or by a detector of the magnetic field produced in the coupling unit.

Moreover the device of the invention comprises a control module by means of which a compensating current is calculated and produced, based on the value obtained in the detector.

The current produced by the control module is injected in the conductor by means of a compensation winding arranged on the ferromagnetic core of the coupling unit, and through a filter offering high impedance to high frequencies which prevents the high frequency signal to be injected from being affected by the injection of the compensating current.

The injection of the compensating current produces a magnetic field in the ferromagnetic core, equal and opposite to that produced by the current which is circulating through the conductor, so that saturation is avoided of the magnetic core of the inductive coupling unit, whereby insertion loss is not added and the maximum efficiency is obtained in the transmission of the signals over the electricity grid.

In an embodiment of the invention the detector is constituted by means of a device for measuring the magnetic field inside the ferromagnetic core of the coupling unit. The signal provided by the detector is compared with a reference signal, which preferably is zero, and is applied to the control module so that the latter generates the compensating current to obtain a signal from the detector equal to the reference signal.

The injection of the current produced by the control module is carried out through a low pass filter and by means of a compensation winding which is arranged around the ferromagnetic core of the inductive signal coupling unit.

The device of the invention also foresees that it comprises a single winding around a double core which constitutes the ferromagnetic core of the coupling unit in order to carry out simultaneously the detection, the obtaining of the compensating current and the injection of said current.

Next, to assist in a better understanding of this descriptive specification and being an integral part thereof, some figures are appended wherein by way of illustration and not restrictively, the object of the invention has been represented.

DESCRIPTION OF SOME EMBODIMENTS OF THE INVENTION

A description is made below of several embodiments of the invention, making reference to the numbering adopted in the figures.

The embodiments of the invention refer to the injection of a specific signal onto a conductor of the electricity grid, over which a low frequency current 1 is circulating, and onto which conductor a high frequency signal is desired to be injected.

Figure 1:
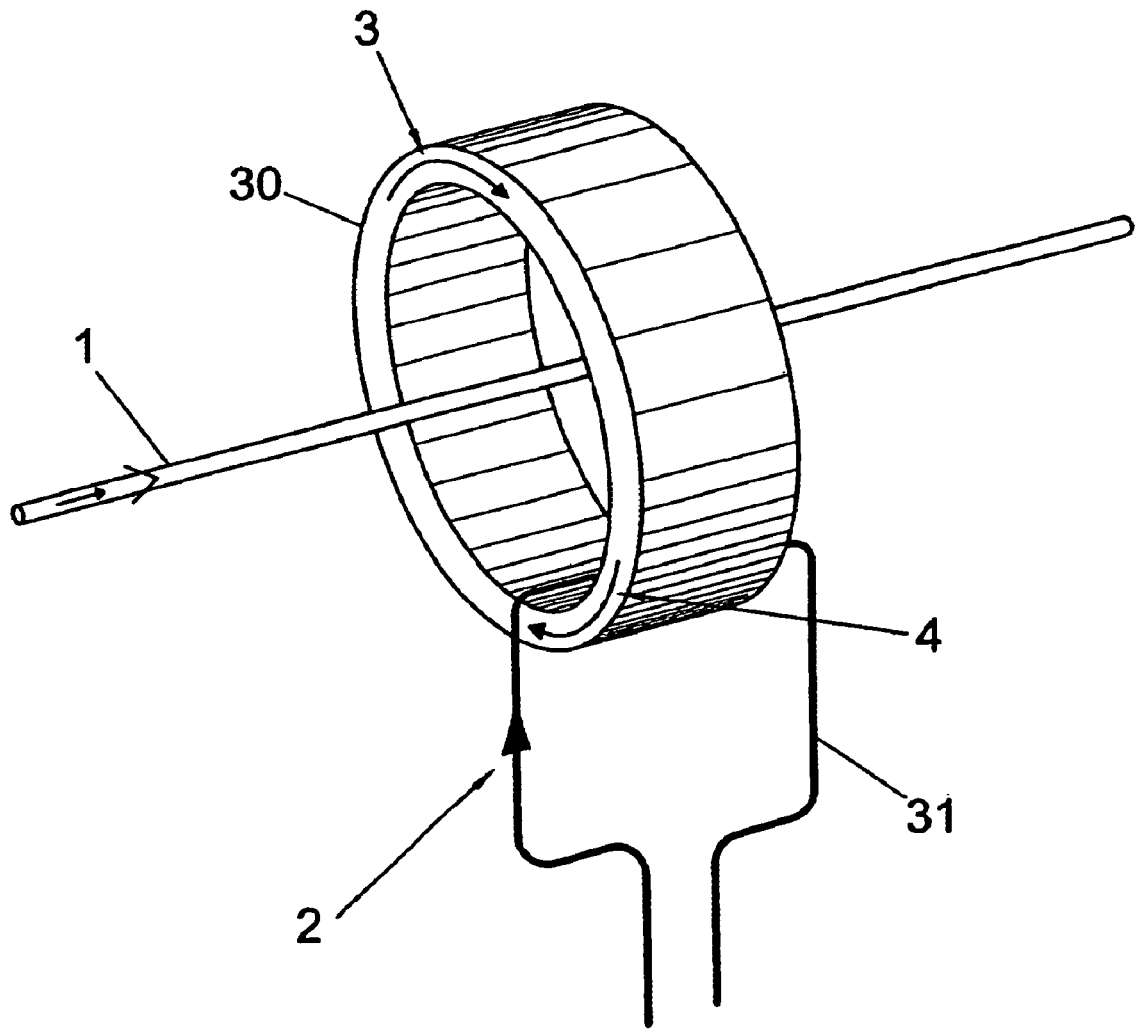
FIG. 1.—It shows an inductive coupler of the state of the art in schematic form, in which the problem of saturation of the ferrite core can arise.

Based on FIG. 1 a generic description is provided of the problem presented in the state of the art. The employ of inductive couplers is known for injecting a determined signal onto a conductor through which a current 1 is circulating. To this end the inductive coupler is constituted by a ferromagnetic core 30 arranged around the conductor onto which one desires to inject the signal, and in which is included a winding 31 to which a current 2 is applied that produces a magnetic field 4 in the ferromagnetic core 30, which induces a current in the conductor. This device has the drawback that the current 1 which is circulating through the conductor also produces a magnetic field 3 in the ferromagnetic core 30, so that if said magnetic field 3 is high, saturation of the ferromagnetic core 30 occurs, whereby the current 2 is unable to increase the value of the magnetic field and hence no current is induced in the conductor, and therefore the desired signal is not injected.

Figure 2:
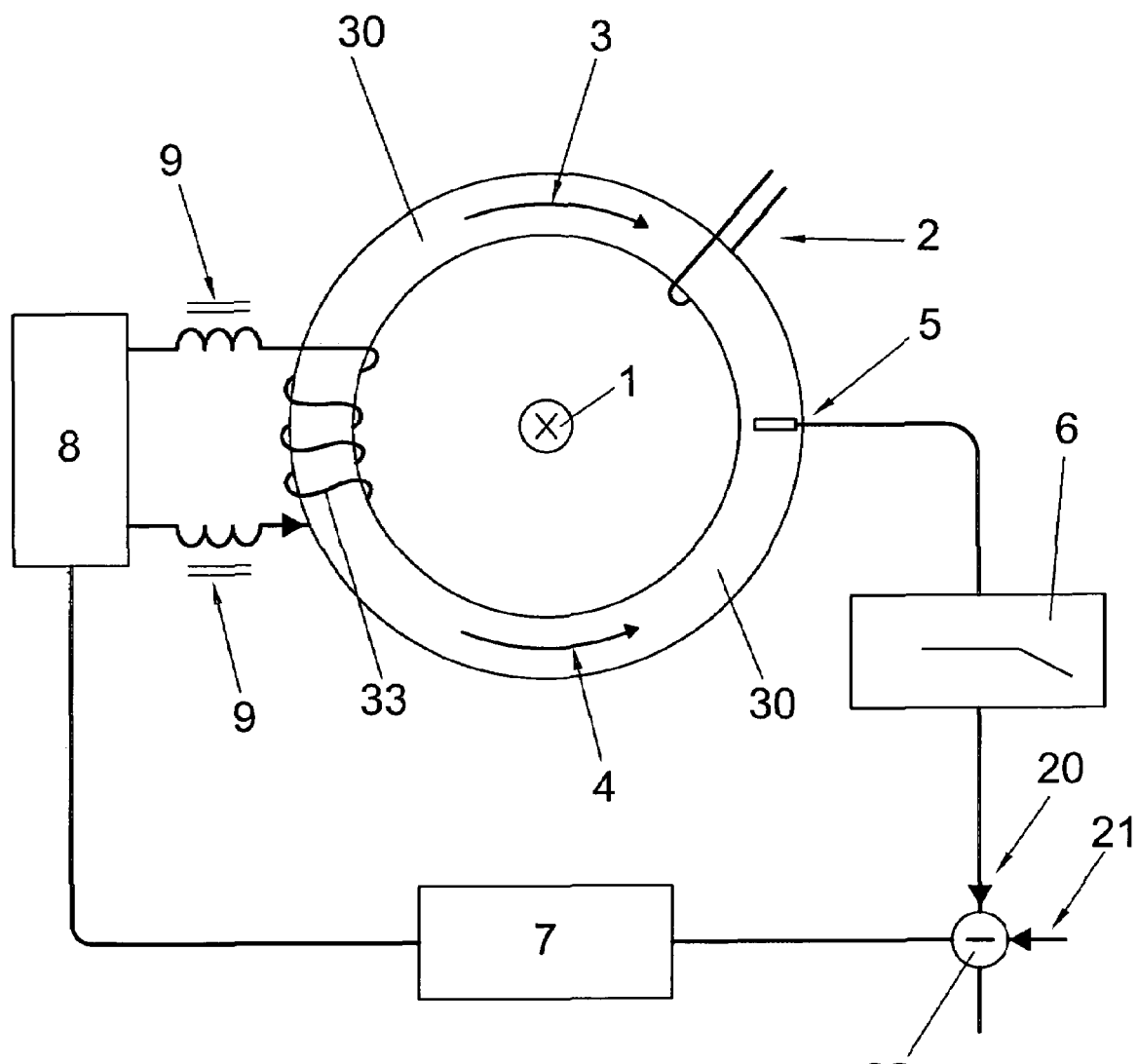
FIG. 2.—It shows an embodiment of the device of the invention which carries out magnetic field detection in order to inject the compensating current.

To overcome this drawback, an embodiment is shown in FIG. 2 wherein a Hall-effect sensor 5 is mounted on the ferromagnetic core 30, which sensor requires an external power supply in order to be able to work (not shown in the figure). In this case the current 1 which is circulating through the conductor likewise produces a magnetic field 3 in the ferromagnetic core 30, which is detected by the sensor 5, the signal obtained being applied to a low pass filter 6 which smoothes the obtained signal.

The detected and filtered signal has been referred to with the number 20, which signal is applied to a comparator 32 which in turn receives a reference signal 21, and which moreover is connected to a control module 7, which calculates and generates a compensating current to maintain the signal 20 equal to the value of the reference signal 21. The compensating current is applied through a power stage 8 and a radiofrequency choke 9 to a winding 33 arranged on the ferromagnetic core 30, producing in the latter a magnetic field 4 equal and opposite to the field 3 produced by the current 1, so that a compensation of the magnetic field 3 occurs, so that the ferromagnetic core 30 is not saturated, whereby the current 2 is induced in the conductor without additional insertion loss.

By means of the radiofrequency chokes 9 low pass filters are obtained which impede the passage of the high frequencies produced by the signal to be injected.

Figure 3:
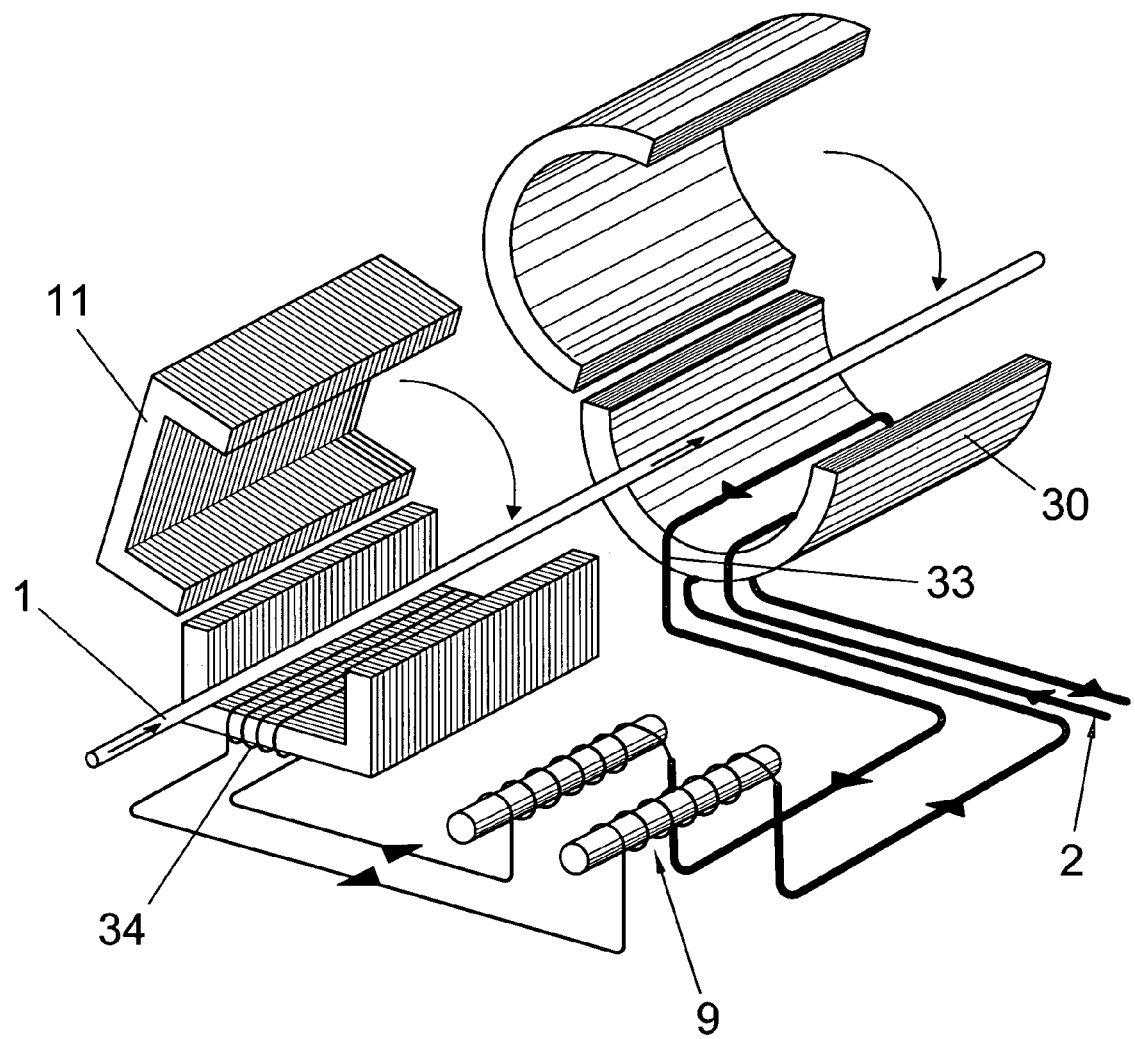
FIG. 3.—It shows an embodiment of the device of the invention wherein the current is measured in the conductor and the compensating current is automatically injected.

In another embodiment of the invention, as shown in FIG. 3, the current 1 which circulates through the conductor is obtained by means of an external ferromagnetic core 11 on which a coil 34 has been arranged wherein, from the magnetic field produce by current 1 in the ferromagnetic core 11, said current 1 is produced in the coil 34, this current 1 being applied, through the radiofrequency choke 9 to the winding 33, the compensation of the magnetic field being produced in the manner described for the example in the previous figure.

Figure 4:
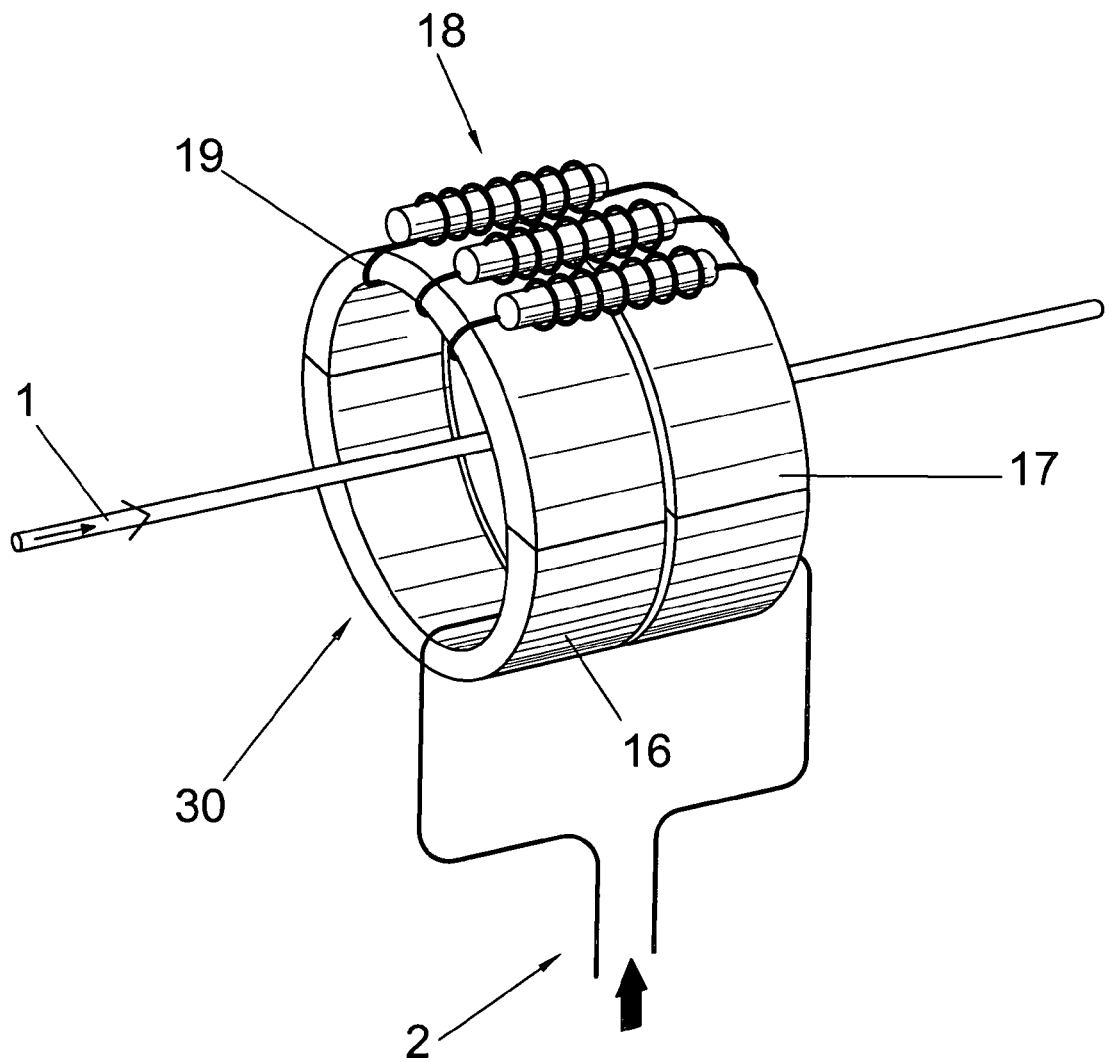
FIG. 4.—It shows another embodiment of the device in which the current is measured in the cable and the compensating current is injected automatically.
Figure 5:
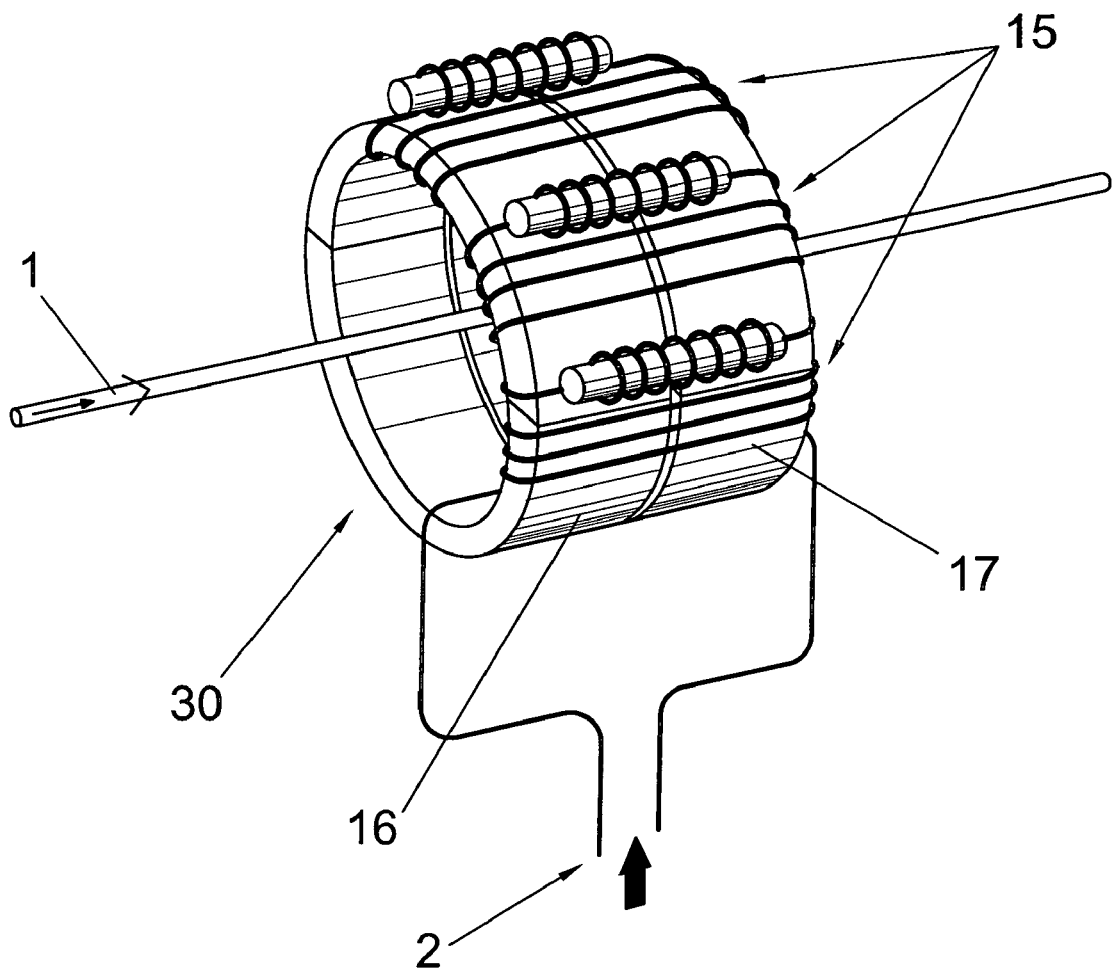
FIG. 5.—It shows another embodiment of the device wherein, as in the case of the previous figure, the current is measured in the conductor and the compensating current is automatically injected.

Lastly in FIGS. 4 and 5 other examples are shown for compensation of the magnetic field 3 produced by current 1. Thus, in the example of FIG. 4 the employ is foreseen of two inductive couplers constituted by a double ferromagnetic core 16 and 17 that form the ferromagnetic core 30. The ferromagnetic core 16 is a power transformer, not suitable for radiofrequency, that is, it has a very high magnetic permeability at low frequencies and very low at high frequencies; whilst the ferromagnetic core 17 is suitable for radiofrequency; that is, it has a very low magnetic permeability at low frequency and very high at high frequency.

In this case the detection and obtaining of the compensating current is carried out simultaneously by locating a winding around the double ring of the coupler. The magnetic induction, produced by the current which is passing through the cable, is detected by the winding and produces therein the current which later serves to perform the compensation. To this end, n coils are mounted which act as radiofrequency chokes 18 and which enclose both ferromagnetic cores 16 and 17, a smaller nominal current being achieved in each winding 19, so that said current carries out the desired compensation of the magnetic field induced by the current 1 which is circulating through the conductor. In this way the magnetic field 3 is only induced in the ferromagnetic core 16 and the magnetic field 4 in the ferromagnetic core 17 preventing the aforesaid saturation from taking place.

In FIG. 5 an alternative embodiment is shown in which n windings are mounted short-circuited by means of a radiofrequency choke 15. This case is equivalent to the previous one, but it has the advantage of reducing the number of choke coils necessary to carry out the compensation.

Figure 6:
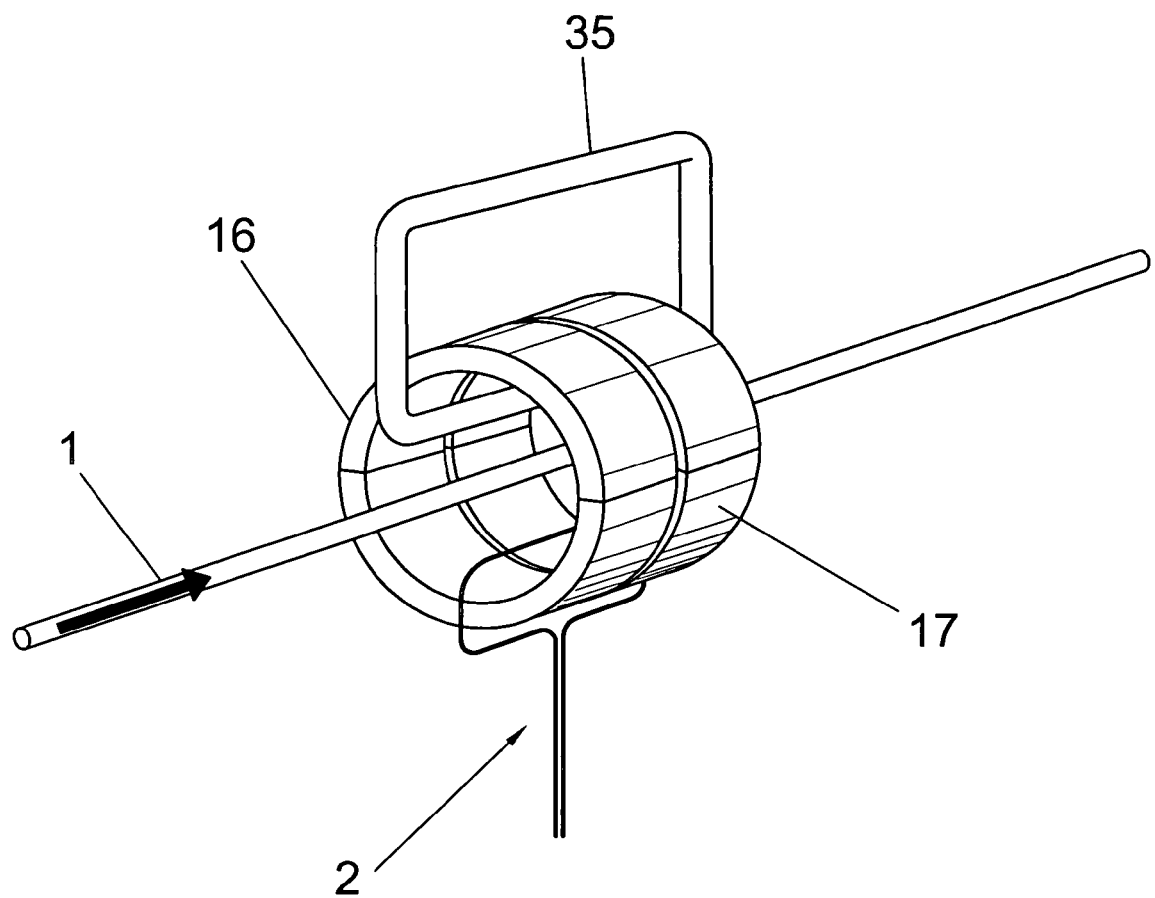
FIG. 6.—It represents another embodiment of the device wherein the detection, the obtaining of the compensating current and the injection of said current are carried out simultaneously by means of a single winding.

In FIG. 6 another alternative embodiment is shown of a device which implements the process of the invention. In this device a single winding 35 is used around the double ferromagnetic core 16 and 17 that forms the ferromagnetic core 30 of the coupling unit. This case is similar to that presented in FIG. 5, but with the advantage of reducing the number of windings and without having to use choke coils for the compensation. By means of said winding 35 the detection and obtaining of the compensating current are carried out simultaneously. Moreover, and because the winding has a high impedance at low frequencies and has a low impedance at high frequencies, the injection of the compensating current is carried out simultaneously by mounting said winding 35, whereby a low cost solution is obtained.

What is claimed is:

1. PROCESS FOR COMPENSATING THE LOW FREQUENCY MAGNETIC FIELD IN AN INDUCTIVE SIGNAL COUPLING UNIT, wherein the coupling unit comprises a ferromagnetic core (30) which encloses a conductor through which a low frequency current (1) is circulating to inject a high frequency signal therein; characterised in that it comprises:

a simultaneous obtaining and injecting of a compensating current by means of an independent ferromagnetic core (16) and a compensation winding (33) provided on the coupling unit which causes that in the inductive coupling unit a magnetic field is produced equal and opposite to that produced by the current circulating through the conductor (1), whereby saturation in the magnetic core of the inductive coupling unit is avoided, and an injecting of the compensating current through a low pass filter which offers high impedance to the high frequency signal desired and a compensation by means of at least one winding (19) with a radiofrequency choke (18) in series with the object that it offer a high impedance to a signal (2) which is injected through a signal winding (31).

2. PROCESS FOR COMPENSATING THE LOW FREQUENCY MAGNETIC FIELD IN AN INDUCTIVE SIGNAL COUPLING UNIT, according to claim 1, characterised in that the conductor is an electricity grid.

3. PROCESS FOR COMPENSATING THE LOW FREQUENCY MAGNETIC FIELD IN AN INDUCTIVE SIGNAL COUPLING UNIT, according to claim 1, characterised in that the obtaining of the compensating current and the injection of said compensating current are carried out by locating a winding of a single winding (35) around a double core (16) and (17) which form the ferromagnetic core (30) of the coupling unit.

4. DEVICE FOR COMPENSATING THE LOW FREQUENCY MAGNETIC FIELD IN AN INDUCTIVE SIGNAL COUPLING UNIT, wherein the coupling unit comprises a ferromagnetic core suitable for radiofrequency presenting a very low magnetic permeability at low frequency and very high at high frequency which encloses a conductor through which a low frequency current (1) is circulating to inject a high frequency signal; characterised in that it comprises:

a ferromagnetic core (16) with a high magnetic permeability at low frequency and very low at high frequency and which saturates with a high magnetic field strength, in order to obtain the magnetic flux due to the low frequency current which is circulating through the conductor (1); and a compensation winding (19) which encloses the cores (16) and (17), through which the low frequency current is simultaneously obtained and applied which produces the magnetic field compensation in the core (17) and preventing the magnetic saturation of said core, said compensation circuit presenting a high-impedance low-pass filter effect to block the high frequency signal (2) desired onto the conductor (1) through the signal winding (31).

5. DEVICE FOR COMPENSATING THE LOW FREQUENCY MAGNETIC FIELD IN AN INDUCTIVE SIGNAL COUPLING UNIT, according to claim 4, characterised in that the conductor through which the low frequency current (1) is circulating is an electricity grid.

6. DEVICE FOR COMPENSATING THE LOW FREQUENCY MAGNETIC FIELD IN AN INDUCTIVE SIG-

NAL COUPLING UNIT, according to claim 4, characterised in that the compensation winding which encloses the cores (16) and (17) of the coupling unit is formed by at least one winding (19) with a radiofrequency choke (18) in series with the object of offering a high impedance to the signal (2) which is injected through the signal winding (31).

7. DEVICE FOR COMPENSATING THE LOW FREQUENCY MAGNETIC FIELD IN AN INDUCTIVE SIGNAL COUPLING UNIT, according to claim 4, characterised in that it comprises a single winding (35) around a double core (16) and (17) which constitutes the core (30) of the coupling unit in order to carry out simultaneously the obtaining of the compensating current and the injection of said current.

\* \* \* \* \*